United States Patent [19]

Lietar et al.

[11] 4,153,367
[45] May 8, 1979

[54] METHOD AND DEVICES FOR LOCALIZING FLAT CHIPS ON A CARRIER PLATE

[75] Inventors: Christian Lietar; Pierre Jeannin, both of Morges, Switzerland

[73] Assignee: Robert Bosch GmbH, Stuttgart, Fed. Rep. of Germany

[21] Appl. No.: 797,191

[22] Filed: May 16, 1977

[30] Foreign Application Priority Data

May 19, 1976 [DE] Fed. Rep. of Germany ....... 2622283

[51] Int. Cl.² ...................... G01B 11/27; G02B 27/38
[52] U.S. Cl. ................................ 356/400; 250/237 G
[58] Field of Search .............................. 356/110-111, 356/138, 172; 250/237 R, 237 G, 561; 350/81

[56] References Cited

U.S. PATENT DOCUMENTS

| 3,269,254 | 8/1966 | Cooper et al. | 356/138 |
| 3,544,801 | 12/1970 | Dyck | 250/237 R |
| 3,811,779 | 5/1974 | Jacobs et al. | 356/172 |
| 3,861,798 | 1/1975 | Kobayashi et al. | 356/172 |
| 3,891,321 | 6/1975 | Hock | 356/111 |
| 3,996,463 | 12/1976 | Jablonowski | 250/237 G |

Primary Examiner—John K. Corbin
Assistant Examiner—Wm. H. Punter
Attorney, Agent, or Firm—Frishauf, Holtz, Goodman & Woodward

[57] ABSTRACT

Small reference marks near two corners of a circuit chip in the form of optical gratings in which the grating lines of both reference marks are parallel are illuminated alternately by a laser beam which is projected in the location the reference marks would have if the chip is properly located. Detectors are arranged to pick up the first secondary maximum of each diffraction pattern when the chip is properly located on its carrier plate. Failure of the detectors to respond indicates a chip that must be removed. With a beam-splitting arrangement producing four closely bunched light spots, straddling each of the reference marks, and an appropriate number of detectors, directional error signals are obtainable by which mechanical correction movements can be controlled for automatic localization of the chip. The gratings may be produced at the same time as the integrated circuit as among the surface features of the chip or they may be impressed into the solder beads at the corners of the chip by which the chip is made fast to the carrier plate.

4 Claims, 6 Drawing Figures

METHOD AND DEVICES FOR LOCALIZING FLAT CHIPS ON A CARRIER PLATE

This invention relates to a method of localizing a rigid plate of small dimensions, such as an integrated circuit chip with reference to a carrier plate and also to a rigid plate of small dimensions equipped for its localization on a carrier plate.

Integrated circuits are available on the market as composite bodies consisting of a carrier plate with printed connection conductors and the actual semiconductor platelets on which the integrated circuit structure is provided. The platelet is so affixed to the carrier plate that the input and output connections for the integrated circuit structure are put in contact with the proper connecting conductors, which requires the localization of the platelet (commonly referred to as a "chip") within tolerances that must not exceed a few hundreds of a millimeter. Whereas the carrier plates, consisting for example of ceramic material, can be produced with the necessary accuracy without difficulty, so that their localizing by mechanical means is possible, the same accuracy cannot be reached for the dimensions of the circuit. The circuit chips are obtained by breaking up a sawed-out slice (of an original rod-shaped single crystal of a semiconductor starting material), the slice being broken along score lines to produce a multiplicity of square or rectangular chips. Consequently, irregularities resulting from the breaking up of the slice into chips are present along the edges of the chips. Since the edge of the chip is the only means available for the mechanical localizing of the chips, the number of mislocalized chips, with respect to the carrier plate, found in mass-production of these composite units is relatively high.

It is already known to provide a checking operation after the assembly of the chips on the carrier plate and to disconnect or sever the badly positioned chips. For this inspection operation, according to a known process, an image of the surface of the chip is projected on a highly magnified scale on a screen provided with localizing reference marks. This procedure is, however, time-consuming and uneconomic for mass-production.

It is an object of the present invention to provide a method that enables automatic localizing of the chips within narrow tolerances and to provide chips having features enabling them to be readily localized automatically within narrow tolerances.

SUMMARY OF THE INVENTION

Briefly, a face of the chip parallel to the carrier plate is provided with at least one reference mark in the shape of an optical grating. A laser beam is projected on the desired position of the reference mark and a photoelectric detector is so placed with reference to the source of the laser beam that when the reference mark is in its proper place, a light beam corresponding to one of the secondary maxima of the light pattern produced by the incidence of the laser beam on the grating is picked up by the detector. The detector is constituted so that when such a light beam is detected, a signal is produced by the detector.

The invention is further described by way of illustrative examples with reference to the accompanying drawings, in which.

In accordance with the invention, optical gratings are utilized as reference marks which cover certain regions of each chip. These gratings may be referred to as diffraction gratings and in polychromatic light produce spectra, but with monochromatic light, they produce sharper maxima of light in directions depending upon the light wave length and the periodic spacing of the grating.

Figure 1:
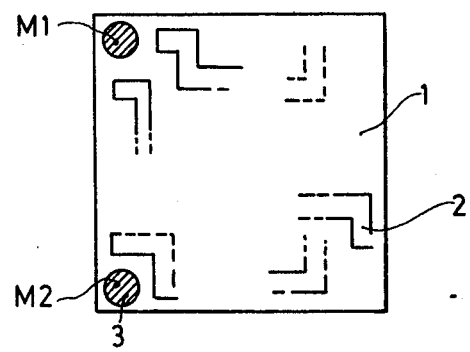
FIG. 1 is a plan view of a semiconductor circuit chip provided with two reference mark gratings in accordance with the invention.

FIG. 1 shows a square chip 1 of silicon with an integrated circuit structure 2 on its upper surface and at two ends of one side of the square face, a circular localization field, respectively $M_1$ and $M_2$, each having a diameter of about B 0.1 mm. Each field $M_1$, $M_2$ consists of an array of parallel bands 3 of equal width formed in a silicon oxide insulation layer covering the chip. The bands 3 can be provided by etching, in accordance with a known process, into the silicon oxide layer that has a thickness of a few tenths of a micron. Each band is a few microns wide and the periodic spacing p (i.e., the spacing between corresponding edges of successive bands) for the grating is so chosen that a laser beam incident on the grating produces a specific diffraction pattern.

Figure 2:
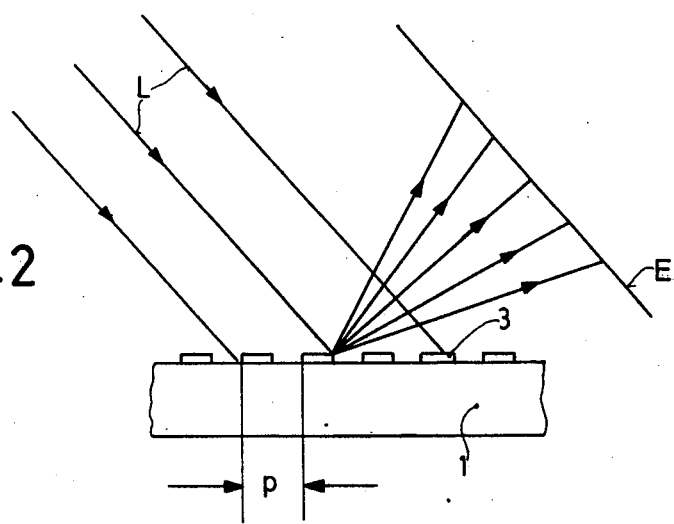
FIG. 2 is a section through a localizing grating, such as provided on the chip of FIG. 1, on a highly magnified scale.
Figure 3:
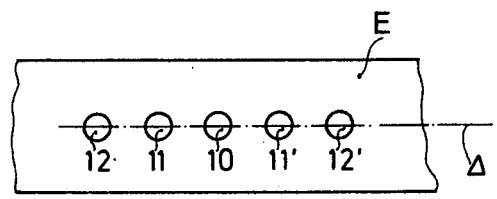
FIG. 3 is a representation of the light pattern produced by the laser illuminated grating.

It is to be noted that the respective bands 3 of the two regions $M_1$ and $M_2$ will preferably run parallel to each other and that their direction is oblique with respect to the principal direction of the integrated circuit structure 2 (most of the features commonly running in two mutually perpendicular directions). The direction of the grating lines is preferably at least 10° different from any of the main lineaments of the integrated circuit structure. The incident ray L can be directed either perpendicularly or obliquely with reference to the plane of the face of the chip 1. It must, however, be contained in a plane perpendicular to the chip, the trace of which on the chip runs perpendicular to the direction of the grating lines (plane of FIG. 2). The reflected light thus remains in the same plane and produces a diffraction pattern on a screen E, which pattern is formed of light spots 10, 11, 11′, 12, 12′ distributed (FIG. 3) along the line Δ. The central spot 10 is produced by the ordinary reflection rays, whereas the spots on either side of it, the spots 11, 11′, 12, 12′ represent the secondary maxima of the diffraction pattern. Their distances from the spot 10 depend, among other things, on the above-mentioned transverse dimension p of the grating. Since the direction of the straight line depends upon the direction of the grating lines, the line Δ rotates around the center of the spot 10 when the chip is rotated in the plane of its face.

In a first embodiment of a method according to the invention, the laser beam L is alternately directed onto each of the gratings $M_1$ and $M_2$ in order to produce inspection check signals by means of the two first secondary diffraction beams, which designate a chip as satisfactory whenever both of these secondary beams fall at the proper place on the screen E.

Figure 4:
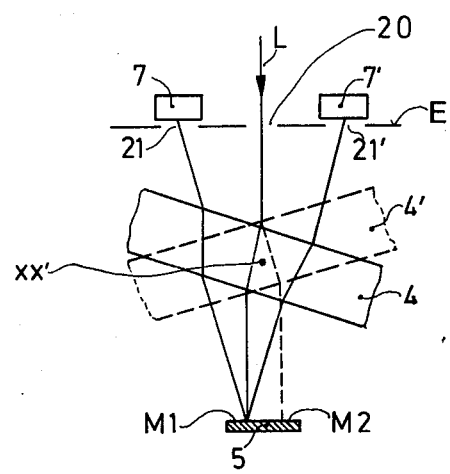
FIG. 4 is a diagrammatic representation of an apparatus for carrying out a first illustrative example of a method according to the invention.

In order to obtain this result, the screen E is provided with holes 21, 21' and so on (FIG. 4), which are exactly at the locations where the aforesaid secondary beams fall on the screen when the laser beam L is incident on the grating and when the orientation of the grating lines corresponds to the desired orientation, hence when the chip is properly localized and the regions $M_1$ and $M_2$ are at their proper places. Photoelectric detectors 7 and 7' are provided at the holes 21 and 21'. Below the screen E a parallel-plane glass plate 4 is mounted so as to be rotatable about an axis X, X' running perpendicular to the connection line between the midpoints of the gratings $M_1$ and $M_2$ and parallel to the screen E and to the chip face. This glass plate can be swung from the position shown in FIG. 4 by solid lines to the symmetrical position shown in broken lines and designated 4'. The operation of this apparatus is as follows: when the glass plate 4 is in the position shown in solid lines, the vertically directed laser beam L is shifted to the left in the plate 4 so that it then falls perpendicularly on the proper location of the grating $M_1$. If the grating is at its proper location, the beams produced by diffraction at the grating will pass through the plate 4 as shown in FIG. 4 and reach the detectors 7 and 7'. If, however, the grating is outside of its proper place, the laser beam will be scattered by the surface of the chip 5 and/or reflected in the direction of the hole 20. Only the scattered light reaches the detectors 7 and 7'. It is much weaker than the diffraction pattern light previously considered. If at the proper location for the grating a rectilinear boundary (linearment) of the circuit should happen to be located, and if this boundary should be parallel to the grating lines, a diffraction beam would likewise be produced that might by chance reach the detectors 7 and 7'. These rays would be much weaker, however, than in the case first considered. By suitable calibration of the detectors, the apparatus described can readily be made so that it will produce a signal only when the grating is in its own proper location. Experiments have shown that the defraction pattern of a laser beam of, for example, 0.1 mm, diameter is incident upon a grating having a diameter of the same value, a relative deviation of the effective grating location from that defined by the incident beam of a few hundredths of a millimeter produces a weakening of the light at the detector that is sufficiently large for reliably controlling the severing or other eliminative action on the offending chip.

After the checking of the proper location of the grating $M_1$, the glass plate 4 is swung until it reaches the position 4'. This allows checking the location of the grating $M_2$ in the same way as for the grating $M_1$. If both gratings of a chip are in the right place, a corresponding signal is produced by the detectors, whereas in other cases, if at least one of the two gratings is not in its proper place, the absence of the signal or the transmission of a rejection signal directs the severing of the chip.

Figure 5:
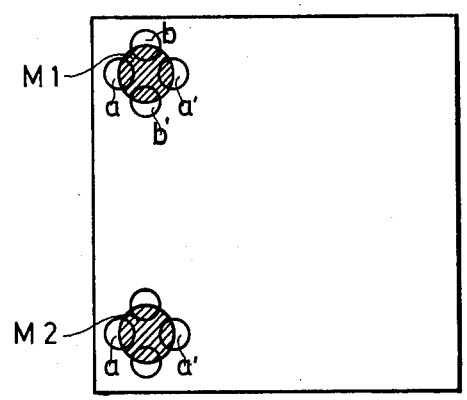
FIG. 5 is a plan view of a chip for explaining a second illustrative example of a method according to the invention.
Figure 6:
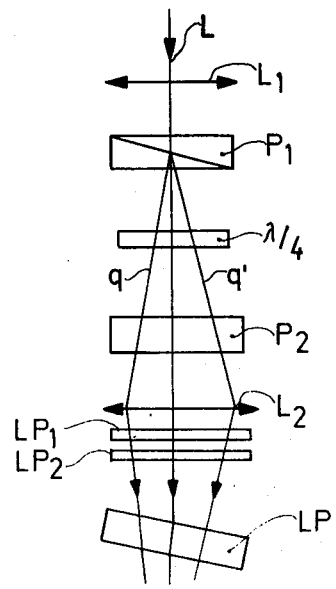
FIG. 6 is a diagrammatic representation of an apparatus for carrying out a second illustrative example of a method according to the invention.

FIGS. 5 and 6 relate to another embodiment of an apparatus for carrying out the method of the invention, in which localization errors that are detected can be corrected, so that an automatic localization can be carried out. This equipment comprises a lens $L_1$ parallel to the plane of the face of the chip 5, a first Wollaston split prism $P_1$ which produces two separate beams q and q' respectively polarized perpendicularly to each other and other components presently to be described. A filter of the kind known as a quarterwave plate converts the linearly polarized rays q and q' into circularly polarized rays, which then pass through a second Wollaston prism $P_2$. Since the prism $P_2$ is oriented perpendicularly to prism $P_1$, each ray q and q' produces two separate rays such that the laser beam L now subdivided by 4 and focussed by the lens $L_2$ on the chip 5 produces four spots a,a', b,b' on this chip which lie in the corners of the square. If now at the desired location defined by the center of the square, there is located a grating $M_1$ or $M_2$ having a diameter big enough so that the grating intersects the four spots, four parallel diffraction patterns are produced, the first secondary maxima of which are picked up by four detector pairs for a suitable response.

FIG. 5, the spots corresponding to each grating are designated a,a',b,b', where a and a' in each case designate the spots at the end of the same diagonal of the square and the two others designate the spots at the end of the other diagonal. By comparison of the response of the corresponding detectors to the spots a and a', the direction of the necessary correction along the line aa' can be determined. The same can be done for response to the spots b and b' by the corresponding detectors to determine the correction, if any, of the direction of the line bb'.

An additional arrangement of components $LP_1$ and $LP_2$ makes it possible to simulate the necessary correction and thereby to determine its value quantitatively. $LP_1$ and $LP_2$ are two plane-parallel plates that are mounted so as to be rotatable about an axis parallel to the face of the chip 5. The rotation axes of the two plates $LP_1$ and $LP_2$ are perpendicular to each other in the aforesaid plane. By rotating of the plates $LP_1$ and $LP_2$, the light spots produced by the laser beam are shifted by measurable distances on the chip 5. If now the detectors are so arranged that when the light beams have the same intensity a null signal is produced, the obtaining of such a null signal causes the position then assumed by the plates $LP_1$ and $LP_2$ to indicate the value of the necessary relative shift of the chip with respect to the carrier plate in the respective directions a,a' and b,b', so that the null signal will then be produced when the correction plates $LP_1$ and $LP_2$ are in positions parallel to the face of the chip.

The system here described also comprises a third swinging plate LP that operates like the plate 4 of FIG. 4 in order to direct the laser beam alternately on the grating $M_1$ and on the grating $M_2$ of the chip under examination.

After the two error values $\Delta a_1$ and $\Delta b_1$ referring to the localization of the grating $M_1$ are obtained as above described, it is sufficient with respect to the grating $M_2$ to determine a single error value, namely, the necessary shift $\Delta a_2$ in the direction aa', or, to state the matter more exactly, to determine the difference $\Delta a_2 - \Delta a_1$ between the necessary shifts of the gratings $M_2$ and $M_1$ in the direction aa'.

The error values thus obtained serve to propel the substrate for the chip, the chip 5 or the carrier plate itself by means of electric motors, cylinder and piston combinations, or displacement means of other kinds, so that the chip 5 will take up the desired location with reference to the carrier plate.

The great advantage of the method here described consists in that the provision of the reference marks $M_1$ and $M_2$ in the form of a grating on each chip requires practically no additional expense in the construction of integrated circuit units. The gratings can be formed along with the circuit pattern, that is, with the same masks and by the same operations which are used to produce the circuit structure. Furthermore, the space requirement of the reference marks is very small, because the gratings can be located immediately adjacent to the structural elements of the circuit. The gratings can also be produced by imprinting in relief (i.e., impressing) the surface of the solder beads provided for fastening the chip to its carrier plate.

Although the invention has been described with reference to particular illustrative examples, variations and modifications are possible within the inventive concept.

We claim:

1. Method of localizing a chip of rigid material and small dimensions with reference to a carrier plate, preparatory to fixing said chip to said carrier plate, comprising the steps of:

providing a pair of reference marks each in the form of an optical grating on a face of the chip to be localized that is parallel to the carrying surface of the carrier plate, the gratings of the respective reference marks being parallel to each other and the reference marks being respectfully located in regions spaced apart from each other and unsymmetrically disposed with respect to the center of said chip;

directing a laser beam alternately to the respective desired locations of said reference marks;

detecting light produced by said laser beam and reflected from said chip to be localized alternately in at least two light detectors so positioned and oriented as to receive light beams respectively corresponding to one of the secondary maxima produced by the incidence of the laser beam on each of said optical gratings when the respective reference mark is in the desired position, and providing a signal when said light beam is received in each said detector and determining with reference to said signals when both of said reference marks are in the corresponding desired position.

2. A method as defined in claim 1 in which the step of directing a laser beam involves directing a laser beam that is separated into portions, each of which falls upon a different segment of the edge of the reference mark to which the laser beam is directed, and in which the step of detecting light produced by said laser beam and reflected from said chip, detection is made by a plurality of detectors responsive to the diffraction patterns of the respective portions of said laser beam, and in which there is also included the step of obtaining a correction signal by comparison of the signals produced by the respective detectors and the step of correcting the position of a plate to be localized in response to said correction signals.

3. A method as defined in claim 1 in which said chip has two pairs of parallel edges at right angles to each other and in which the regions in which said reference marks are located are regions of a face of the chip adjacent to two corners of the chip at opposite ends of one edge of the chip.

4. Method of localizing a chip of rigid material and small dimensions with reference to a carrier plate preparatory to mounting the chip on the plate, comprising the steps of:

providing at least one reference mark in the form of an optical grating on a face of the chip to be localized that is parallel to the carrying surface of the carrier plate;

directing to the desired location of said reference mark a laser beam that is separated into portions, each of which falls upon a different segment of the edge of said reference mark;

detecting light produced by said laser beam and reflected from said chip, using therefor a plurality of detectors responsive to the respective diffraction patterns of the respective portions of said laser beam and so positioned and oriented and each to receive a light beam corresponding to one of the secondary maxima produced by the incidence of the respective portion of said laser beam on said optical grating when said reference mark is in the desired position;

obtaining signals respectively from said detectors when said laser beam is received by the respective detector;

obtaining a correction signal by comparison of the signals produced by the respective detectors, and correcting the position of the plate to be localized in response to said correction signals.

* * * * *